(12) United States Patent
Aksyuk et al.

(10) Patent No.: US 7,145,248 B2
(45) Date of Patent: Dec. 5, 2006

(54) COMMON CONNECTION METHOD FOR FLIP-CHIP ASSEMBLED DEVICES

(75) Inventors: Vladimir Anatolyevich Aksyuk, Piscataway, NJ (US); Dustin W Carr, Pittstown, NJ (US); Flavio Pardo, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/185,249

(22) Filed: Jun. 28, 2002

(65) Prior Publication Data

US 2004/0000724 A1    Jan. 1, 2004

(51) Int. Cl.
*H01L 23/48* (2006.01)
*H01L 23/52* (2006.01)
*H01L 29/40* (2006.01)

(52) U.S. Cl. .................... 257/778; 257/686; 438/108
(58) Field of Classification Search ............... 257/778, 257/685, 686, 723, 730, 777, 784, 786; 438/107–110, 438/612, 617, 666
See application file for complete search history.

(56) References Cited

U.S. PATENT DOCUMENTS 5,177,669 A * 1/1993 Juskey et al. ............... 257/675
6,683,384 B1 * 1/2004 Kossives et al. ............ 257/777

FOREIGN PATENT DOCUMENTS

EP        0486829 A2 *  5/1992

* cited by examiner

*Primary Examiner*—Hoai Pham
*Assistant Examiner*—Dilinh Nguyen
(74) *Attorney, Agent, or Firm*—Eugene J. Rosenthal

(57) ABSTRACT

The planes of chips in a flip-chip arrangement, when at least one of the chips has an insulating layer running through it, may be electrically connected together by incorporating into the top chip a flexible metalized structure which is pinned to the top layer of the bottom chip using a wire bond ball which is connected to a wire that is attached to a pad on the top layer of the upper chip. A single connection connects both layers of the top chip to the layer on the bottom chip. The flexible structure may be similar to a collapsible cup with a hole in the middle or it may be a tiltable micro mirror.

24 Claims, 4 Drawing Sheets

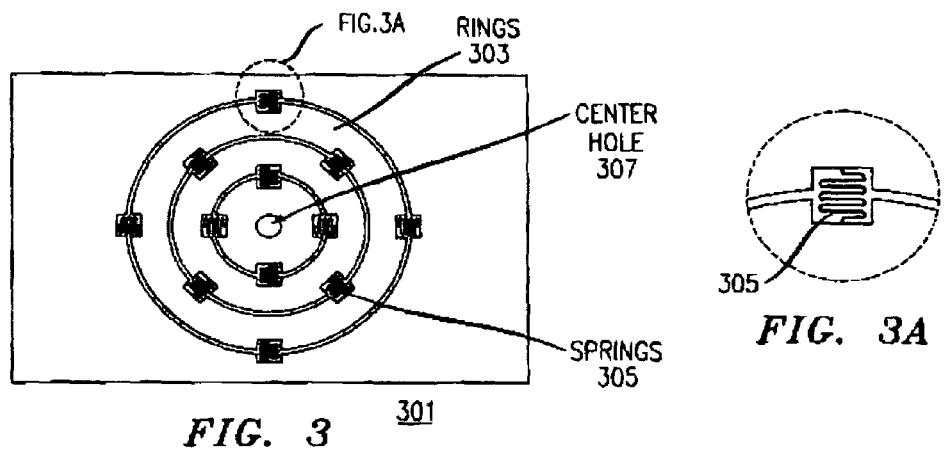
FIG. 3
FIG. 3A
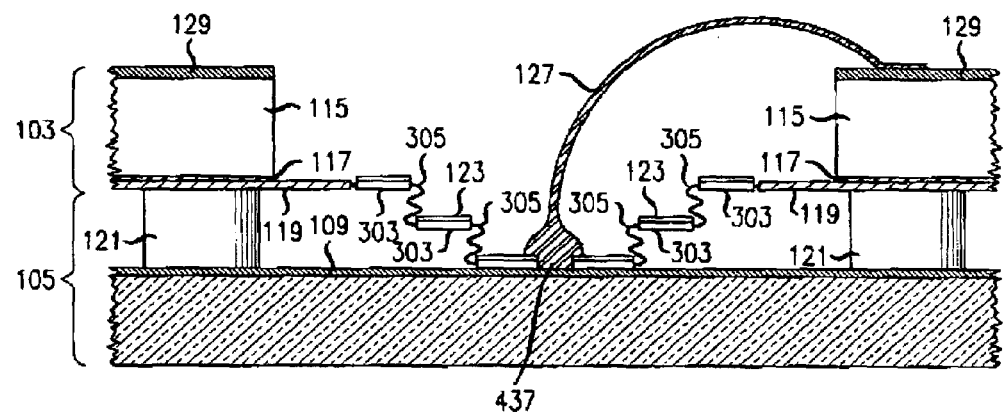
FIG. 4

COMMON CONNECTION METHOD FOR FLIP-CHIP ASSEMBLED DEVICES

TECHNICAL FIELD

This invention relates to the art of flip-chips, and more particularly, to a method for connecting planes of the chips that are connected together in a flip-chip arrangement using a nonconductive spacer between the chips when at least one of the chips has an insulating layer running through it.

BACKGROUND OF THE INVENTION

Flip-chip assemblies are formed by combining two separate chips. Usually one of the chips contains spacers that offset the facing surfaces of each of the chips. For microelectromechanical systems (MEMS) devices, at least one of the chips is often formed using silicon-on-insulator (SOI) technology. In an SOI chip, the top layer of silicon is electrically isolated from the underlying silicon wafer by a silicon oxide layer. Once the two chips are bonded together, it is often desired to electrically connect at least one layer of the bottom chip and one layer of the top chip.

Prior art methods for electrically connecting layers of such chips that are so connected together in a flip-chip arrangement when at least one of the chips has an insulating layer running through it include a) solder bumps between the chips, b) bond pads on the top that are connected to counterpart bond pads on the bottom using wires, and c) using conductive epoxy in between the chips and/or a at the edge of the chips to connect all of the layers of the top chip to at least one layer of the bottom chip. Should more than one layer of a single chip need to be connected to the same layer of the other chip, this may be achieved by using vias that run through the insulating layer to connect the two.

These prior art methods are disadvantageous, because a) solder bumps require too much preparation, e.g., so-called "under bump metalizaton", of the chips, b) bond pads connect only one layer of the top chip unless vias are employed, and the use of vias significantly complicates the processing of the top chip, and c) conductive epoxy outgasses chemicals which will redeposit themselves on the structure of the MEMS device if the MEMS device is hermetically sealed, as is often the case, thus degrading the MEMS device.

SUMMARY OF THE INVENTION

We have recognized that electrically connecting planes of chips in a flip-chip arrangement, when at least one of the chips has an insulating layer running through it, may be expediently achieved, in accordance with the principles of the invention, by incorporating into the top chip a flexible metalized structure which is pinned to the top layer of the bottom chip using a wire bond ball which is connected to a wire that is attached to a pad on the top layer of the upper chip. Advantageously, a single connection connects both layers of the top chip to the layer on the bottom chip. The process is overall simpler than the prior art alternatives because the flexible metalized structure is fabricated using the same process steps that are employed for fabricating the other parts of the MEMS device that are on the top chip, and the wire bond process is already being employed to connect the bond pads of flip-chip assembly to leads of its carrier. In one exemplary embodiment of the invention the flexible structure is similar to a collapsible cup with a hole in the middle. More specifically, the flexible structure is a set of concentric rings, each connected to the other, e.g., by springs. In another exemplary embodiment of the invention, the flexible structure is a tiltable micro mirror.

BRIEF DESCRIPTION OF THE DRAWING

In the drawing:

FIG. 3 shows a top view of another flexible structure for use in another exemplary embodiment of the invention;

FIG. 4 shows a side view of an embodiment of the invention using the flexible structure of FIG. 3;

DETAILED DESCRIPTION

Figure 1:
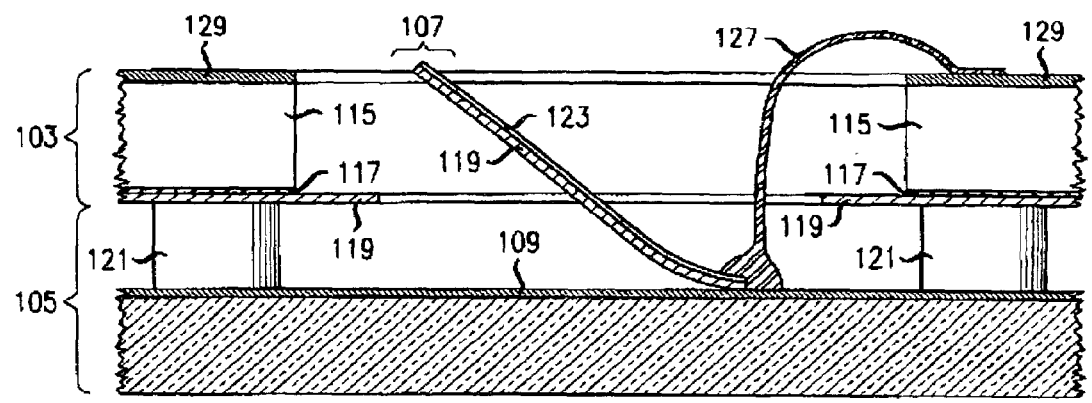
FIG. 1 shows an exemplary flip-chip arranged in accordance with the principles of the invention.

The following merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the invention In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein.

Unless otherwise explicitly specified herein, the drawings are not drawn to scale.

The term micro-electromechanical systems (MEMS) device as used herein is intended to mean an entire MEMS device or any portion thereof. Thus, if a portion of a MEMS device is inoperative, or if a portion of a MEMS device is occluded, such a MEMS device is nonetheless considered to be a MEMS device for purposes of the present disclosure.

In the description, identically numbered components within different ones of the FIGS. refer to the same components.

The planes of chips coupled together in a flip-chip arrangement, when at least one of the chips has an insulating layer running through it, may be expediently electrically connecting, in accordance with the principles of the invention, by incorporating into the top chip a flexible metalized structure which is pinned to the top layer of the bottom chip using a wire bond ball which is connected to a wire that is attached to a pad on the top layer of the upper chip. Advantageously, a singe connection connects both layers of the top chip to the layer on the bottom chip.

FIG. 1 shows flip-chip 101 which is arranged in accordance with the principles of the invention. Flip-chip 101 is made of two chips, chip 103 which includes the mechanical layer and chip 105 which includes the electrical connection layer. Chip 103 may be a silicon-on-insulator (SOI) type of chip made of three layers. The first layer is handle wafer layer 115, which is silicon. The second layer, buried oxide (BOX) layer 117, which is also known as the "sacrificial layer", is an insulator. The third layer, mechanical layer 119, is also silicon, although it a) is typically much thinner than handle wafer layer 115 and b) may be referred to as the device layer. Chip 105 contains spacers 121 that offset the facing surfaces of chips 103 and 105. Spacers 121 may be made of an insulating material.

Thus, without more, the top layer, as shown in FIG. 1, of silicon of SOI chip 103, i.e., handle wafer layer 115, is electrically isolated from mechanical layer 119 by BOX layer 117. However, once the two chips are bonded together, it is often desired to electrically connect at least one layer of bottom chip 105 and one layer of the top chip 103.

Figure 2:
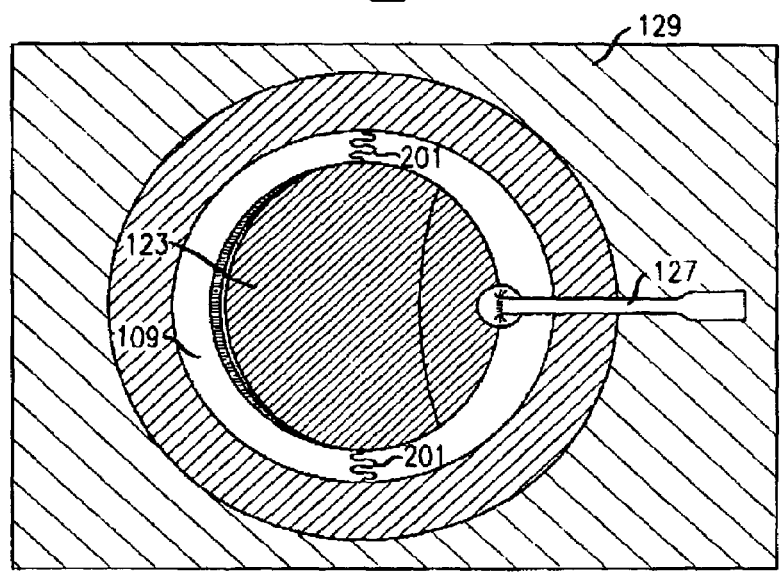
FIG. 2 is a top view of the flip-chip of FIG. 1.

To this end, in one embodiment of the invention, chip 103 includes a conventional MEMS micro-mirror 107. As shown in FIG. 2, which is a top view of flip-chip 101, springs 201 are used to suspend micro-mirror 107. Preferably, micro-mirror 107 is metalized, i.e., it has thin metal layer 123 deposited on it.

Returning to FIG. 1, rather than have a conventional set of electrodes located beneath micro-mirror 107 in order to control its tilt, e.g., as is done for all-optical switching, located beneath micro-mirror 107 is metallic pad 109 which is arranged so that at least it will contact micro-mirror 107 when micro-mirror 107 is fully tilted. Metallic pad 109 is connected to a common potential, typically ground, which is desired to be connected to. Metallic pad 109 may be connected to other locations on chip 105.

Using conventional techniques, one end of a wire bond connection 127 is formed between metal layer 123 and metallic pad 109, thus pinning micro-mirror 107 to metallic pad 109 and electrically connecting metal layer 123 and metallic pad 109. Metal layer 123 may be made of layers of more than one metal. Typically, aluminum, or layers chrome and gold are employed. The particular metal(s) employed are typically chosen by those of ordinary skill in the art based at least one the type of material employed for the wire bond, and also, possibly, on the desired optical characteristics of other micro-mirrors of the structure that may be metalized at the same time. Preferably the wire bond connection is a so-called "ball" wire bond, but other wire bonds, such as "wedge" wire bonds, may be employed. Current wire bond technology often uses gold as the material from which the wire bond is made, although other well-known materials are sometimes used. Typically a ball wire bond is made by melting one end of the wire into a small ball and then smashing the ball and the attached wire onto the surface to which the bond is to be formed.

The other end of wire bond connection 127 is attached to metal layer 129, which is deposited on handle wafer layer 115. As will be recognized by those of ordinary skill in the art of making micro-mirrors, metal layers 123 and 129 could be formed at the same time.

Thus, advantageously, at least handle wafer 115, device layer 119, and metallic pad 109 are electrically connected together via micro-mirror 107 and wire bond connection 127.

FIG. 3 shows a top view of flexible structure 301, which is similar to a collapsible cup but with a hole in the middle, for use in another exemplary embodiment of the invention. More specifically, flexible structure 301 is a set of plates 303, each connected to the other by springs 305, which are shown in more detail in FIG. 3A. In FIG. 3 the plates are concentric rings. However other shaped plates and other arrangements thereof may be employed. For example, a set of rectangular plates may be linearly connected to each other by springs, with one of the plates having a hole therethrough. Indeed, the size and/or shapes of each plate 303 may be different from embodiment to embodiment, or even within the same embodiment, as is desired or required to meet the needs of the implementer. Similarly, the size and/or shapes of hole 307 may be different from embodiment to embodiment, as is desired or required to meet the needs of the implementer. More than one hole may be employed as well.

Although each plate 303 is shown being supported by four of springs 305, more or fewer springs may be employed, depending on the particular implementation, as will be readily recognized by those of ordinary skill in the art.

FIG. 3 shows hole 307 through which one end of a wire bond is formed. A secure coupling of wire bond 127 may be achieved when hole 307 has a diameter that is about 20% less than the diameter of the wire bond ball.

FIG. 4 shows a side view of an embodiment of the invention using flexible structure 301. In FIG. 4 the same flip-chip structure of FIG. 1 is employed, but flexible structure 301 is substituted for micro-mirror 107. In FIG. 4, wire bond 127 is used to hold the innermost plate 303, which may be coated with metal layer 123, to metallic pad 109. More specifically, the ball end of wire bond 127 is placed over and through hole 437 of innermost plate 303. The other end of wire bond 127 is again is attached to metal layer 129, which is deposited on handle wafer layer 115. Thus, advantageously, at least handle wafer 115, device layer 119, and metallic pad 109 are electrically connected together via flexible structure 301 and wire bond connection 127.

Figure 5:
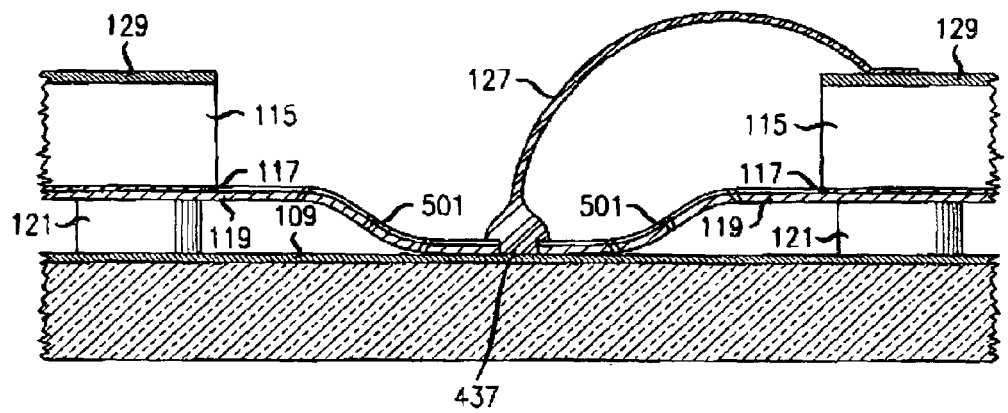
FIG. 5 shows another embodiment of the invention but in which the spacers are very short and the flexible structure is a very thin metalized membrane of silicon with a hole.

FIG. 5 shows another embodiment of the invention using the same basic flip-chip structure of FIG. 4 but in which spacers 121 are very short, e.g., on the order of a few microns. Instead of using flexible structure 301, a very thin metalized membrane of silicon 501 with hole 437 in it is used as the flexible structure. Metalized membrane of silicon 501 is stretched so that the material immediately surrounding hole 437 reaches and is in contact with metallic pad 109, and one end of the wire bond is made through hole 437. The other end of wire bond 127 is again is attached to metal layer 129, which is deposited on handle wafer layer 115. Thus, advantageously, at least handle wafer 115, device layer 119, and metallic pad 109 are electrically connected together via a metalized membrane of silicon 501 and wire bond connection 127.

Figure 9:
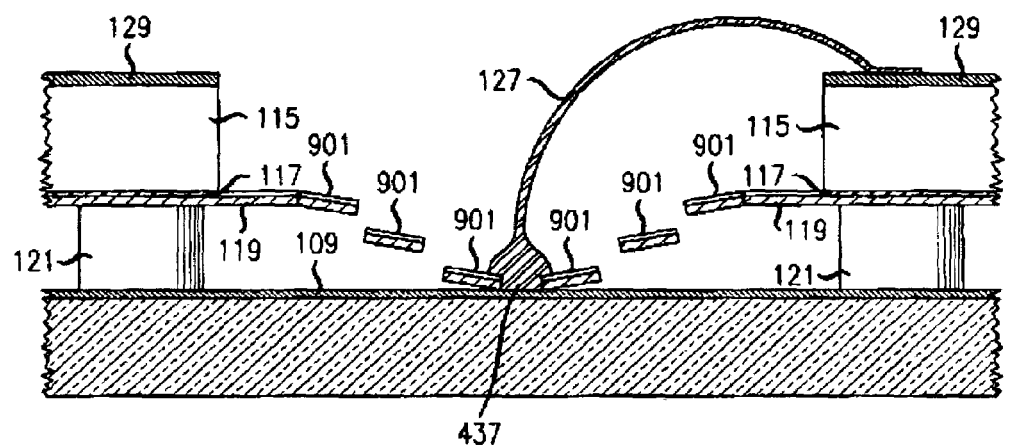
FIG. 9 shows a side view for embodiments of the invention using the same basic flip-chip structure of FIG. 5 but in which the flexible structure may be any of the flexible structures of FIGS. 6, 7, or 8.
Figure 6:
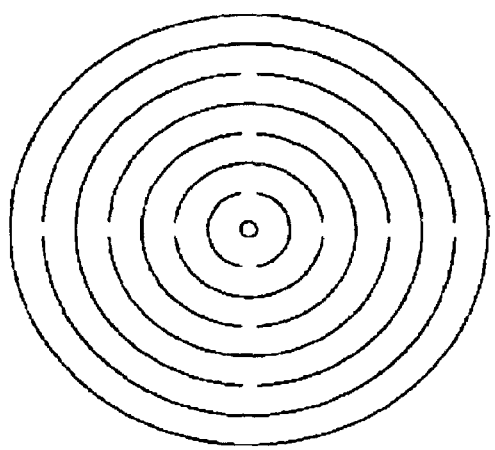
FIG. 6 shows a top view of a flexible structure which is a thin metalized membrane of silicon in which are made annular sections cuts.
Figure 7:
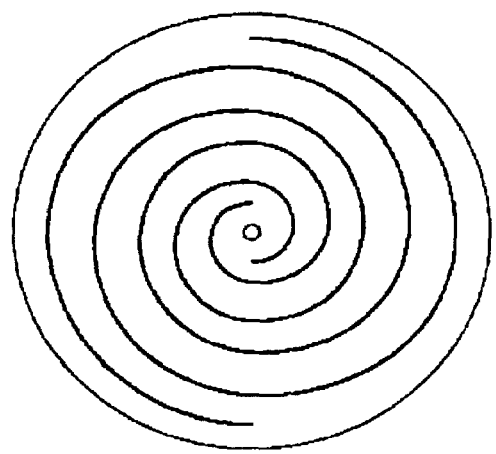
FIG. 7 shows a top view of a flexible structure which is a thin metalized membrane of silicon in which are made spiral cuts.
Figure 8:
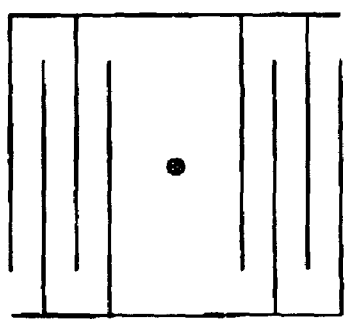
FIG. 8 shows a top view of a flexible structure which is a thin metalized membrane of silicon in which are made straight cuts.

Other embodiments of the invention using the same basic flip-chip structure of FIG. 5 but in which spacers 121 are somewhat longer are possible by making cuts through a metalized membrane of silicon to yield a more pliant and extensible structure in lieu of the more rigid very thin metalized membrane of silicon 501 with hole 437. FIG. 6 shows a top view of a flexible structure where the cuts are annular sections, FIG. 7 shows a top view of a flexible structure where the cuts are spiral, and FIG. 8 shows a top view of a flexible structure where the cuts are straight. FIG. 9 shows a side view of embodiments of the invention using the same basic flip-chip structure of FIG. 5 but where flexible structure 901 may be any of the flexible structures of FIGS. 6, 7, or 8. The embodiment of the invention shown in FIG. 9 using any of the flexible structures of either FIGS. 6, 7, or 8 can achieve lower electrical resistance for the same thickness of device layer 119 than the embodiment of FIG. 4.

Although in FIGS. 4 and 6–9 one end of the wire bond is placed through a hole, this is not required and the wire bond may be made to any surface of the flexible structure that can be pinned to the second chip.

What is claimed is:

1. A flip-chip assembly in which a top chip and a bottom chip are connected, at least said top chip having integral thereto, in that it is made up of, at least a top layer, a bottom layer, and an insulating layer, said insulating layer (i) extending within said top chip between said top layer of said chip abd said bottom layer of said chip so as to electrically isolate said top layer of said top chip from said bottom layer of said top chip, (ii) is not said top layer of said top chip nor said bottom layer of said top chip, and (iii) is located between said top layer of said top chip and said bottom layer of said top chip, said flip-chip assembly comprising:
a flexible structure which is formed as an integral part of said top chip and is electrically coupled to said bottom layer of said top chip; and
a wire bond which pins at least a conductive portion of said flexible structure to a top layer of said bottom chip, said top layer of said bottom chip facing said bottom layer of said top chip when said flip-chip is assembled.

2. The invention as defined in claim 1 wherein said wire bond is a ball wire bond, and it is said ball which pins said conductive portion of said flexible metalized structure to said top layer of said bottom chip.

3. The invention as defined in claim 1 wherein said flexible structure is coated with at least one layer of metal.

4. The invention as defined in claim 1 wherein said wire bond is a wedge wire bond, and it is said wedge which pins said conductive portion of said flexible structure to said top layer of said bottom chip.

5. The invention as defined in claim 1 further comprising a bond pad on a top layer of said top chip coupled to one end of said wire bond.

6. The invention as defined in claim 1 wherein said flexible structure is a micro mirror.

7. The invention as defined in claim 1 wherein said flexible structure is at least one plate coupled to said top chip by at least one spring.

8. The invention as defined in claim 7 wherein said plates are rings concentrically arranged.

9. The invention as defined in claim 7 wherein at least one of said plates has a hole therethrough.

10. The invention as defined in claim 9 wherein at least a portion of said wire bond pass through said hole to pin said conductive portion of said flexible structure.

11. The invention as defined in claim 1 wherein said flexible structure is structure is a set of plates, each plate being coupled to at least one other of said plates by at least one spring.

12. The invention as defined in claim 1 wherein said flexible structure is a membrane formed in a bottom layer of said top chip, said membrane having a hole therethrough.

13. The invention as defined in claim 1 wherein said flexible structure is a membrane formed in a device layer of said top chip, said membrane having a least one cut therethrough.

14. The invention as defined in claim 13 wherein membrane has at least one hole therethrough.

15. The invention as defined in claim 13 wherein said at least one cut is a set of substantially concentric annular section cuts.

16. The invention as defined in claim 13 wherein said at least one cut is a spiral cut.

17. The invention as defined in claim 13 wherein said at least one cut is a set of straight cuts.

18. The invention as defined in claim 1 wherein said bottom layer of said top chip is a device layer.

19. A flip-chip assembly in which a top chip and a bottom chip are connected, at least said top chip having integral thereto, in that it is made up of, at least a top layer, a bottom layer, and an insulating layer, said insulating layer (i) extending within said top chip between said top layer of said chip and said bottom layer of said chip so as to electrically isolate said top layer of said top chip from said bottom layer of said top chip, (ii) is not said top layer of said top chip nor said bottom layer of said top chip, and (iii) is located between said top layer of said top chip and said bottom layer of said top chip, said flip-chip assembly comprising a flexible structure which is formed as an integral part of said top chip and is electrically couple to said bottom layer of said top chip; and is adapted to be pinned by a wire bond to at least a conductive portion of said flexible structure to a top layer of said bottom chip, said top layer of said bottom chip facing said bottom layer of said top chip when said flip-chip is assembled.

20. The invention as defined in claim 19 wherein said flexible structure has a hole therethrough to act as a site for said wire bond.

21. A method for use in assembling a flip-chip in which a top chip and a bottom chip are connected, at least said top chip having integral thereto, in that it is made up of, at least a top layer, a bottom layer, and insulating layer, said insulating layer (i) extending within said top chip between said top layer of said chip and said bottom layer of said chip so as to electrically isolate said top layer of said top chip from said bottom layer of said top chip, (ii) is not said top layer of said top chip nor said bottom layer of said top chip, and (iii) is located between said top layer of said top chip and said bottom layer of said top chip, the method comprising the step of pinning at least a conductive portion of a flexible structure which is formed as an integral part of said top chip and is electrically coupled to said bottom layer of said top chip to a top layer of said bottom chip using a wire bond.

22. The invention as defined in claim 21 further comprising the step of connecting said wire bond to a top layer of said top chip.

23. Apparatus in a flip-chip assembly in which a top chip and a bottom chip are connected, at least said top chip having integral thereto, in that it is made up of, at least a top layer, a bottom layer, and an insulating layer, said insulating layer (i) extending within said top chip between said top layer of said chip and said bottom layer of said chip so as to electrically isolate said top layer of said top chip from said bottom layer of said top chip, (ii) is not said top layer of said top chip nor said bottom layer of said top chip, and (iii) is located between said top layer of said top chip and said bottom layer of said top chip, said flip-chip assembly comprising:

means for pinning at least a conductive portion or a flexible structure which is formed as an integral part of said top chip and is electrically couple to said bottom layer of said top chip to a top layer of said bottom chip using a wire bond; and means for connecting said wire bond to a top layer of said to chip.

24. Apparatus in a flip-chip assembly in which a top chip and a bottom chip are connected, at least said top chip having integral thereto, in that it is made up of, at least a top layer, a bottom layer, and an insulating layer, said insulating layer (i) extending within said top chip between said top layer of said chip and said bottom layer of said chip so as to electrically isolate said top layer said top chip from said bottom layer of said top chip, (ii) is not said top layer of said top chip nor said bottom layer of said top chip, and (iii) is located between said top layer of said top chip and said bottom layer of said top chip, said flip-chip assembly comprising:

means, electrically coupled to said bottom layer of said top chip, which is formed as an integral part of said top chip and is adapted to be extended toward a top layer of said bottom chip; and means for electrically bonding said means which is adapted to be extended to a top layer of said top chip.

* * * * *